United States Patent [19]

Neuberger et al.

[11] Patent Number: 5,668,903
[45] Date of Patent: Sep. 16, 1997

[54] COMPOUND LASER SYSTEM FOR HIGH POWER DENSITIES

[75] Inventors: Wolfgang Neuberger, F.T.Labuan, Malaysia; Vladimir A. Sychugov, Moscow, Russian Federation; Nikolai M. Lyndin, Moscow, Russian Federation; Sergej G. Krivoshlykov, Moscow, Russian Federation

[73] Assignee: CeramOptec Industries, Inc., East Longmeadow, Mass.

[21] Appl. No.: 553,140

[22] Filed: Nov. 7, 1995

Related U.S. Application Data

[63] Continuation-in-part of Ser. No. 361,774, Dec. 22, 1994, abandoned.

[51] Int. Cl.$^6$ .................................................. G02B 6/28
[52] U.S. Cl. ................................ 385/38; 385/37; 385/28; 385/31; 385/46; 372/50
[58] Field of Search .......................... 385/38, 31, 28, 385/50, 33, 37, 45, 46, 48, 49; 372/50

[56] References Cited

U.S. PATENT DOCUMENTS

| | | | |
|---|---|---|---|
| 4,688,884 | 8/1987 | Scifres et al. | 385/38 |
| 4,725,131 | 2/1988 | Goodwin et al. | 385/46 |
| 4,807,954 | 2/1989 | Oyamada et al. | 385/33 X |
| 4,818,062 | 4/1989 | Scifres et al. | 385/38 X |

Primary Examiner—Phan T. H. Palmer
Attorney, Agent, or Firm—Bolesh J. Skutnik

[57] ABSTRACT

A compound laser system for generating beams of high brightness and high power density by constructive phase coherent combination of the beams generated by a number of individual sources of coherent radiation three subsystems: a diode laser subsystem which is the source of power for the system; a combiner subsystem which combines the output of the diode lasers; and, an optional delivery subsystem which may be needed to deliver the combined output to its desired destination for industrial or medical applications. The combiner subsystem may be implemented in its entirety as an Integrated Optical Combiner, a single component performing all the combiner subsystem's functions. A preferred embodiments of the combine subsystem employs optical fibers having shaped cores to provide efficient matching to the geometry of typical laser diodes. Each diode laser's output of a diode laser array is captured by a single optical fiber with a core whose cross-sectional shape is contoured so that major and minor axes of a laser diode's output shape are not larger than major and minor axes of a optical waveguide and whose numerical apertures are closely matched to the numerical apertures in the directions of corresponding axes. The waveguides are combined in a combiner subsystem into a single output source whose cross-sectional shape depends on the number and cross-sectional shape if the input ports. A delivery subsystem takes output from the combiner subsystem using a standard round or contoured optical fiber core, depending on the cross-section shape of the combiner subsystem's output.

14 Claims, 13 Drawing Sheets

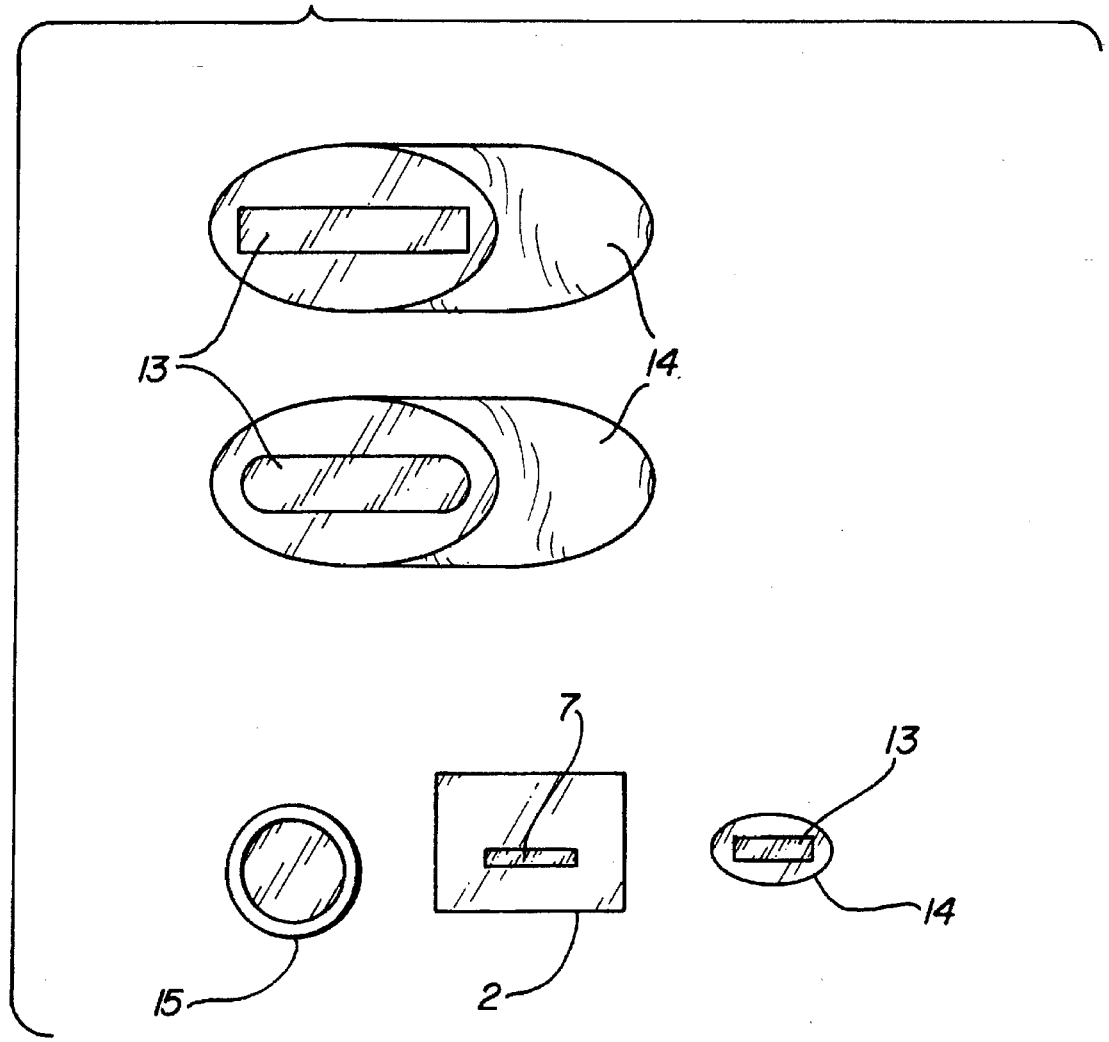

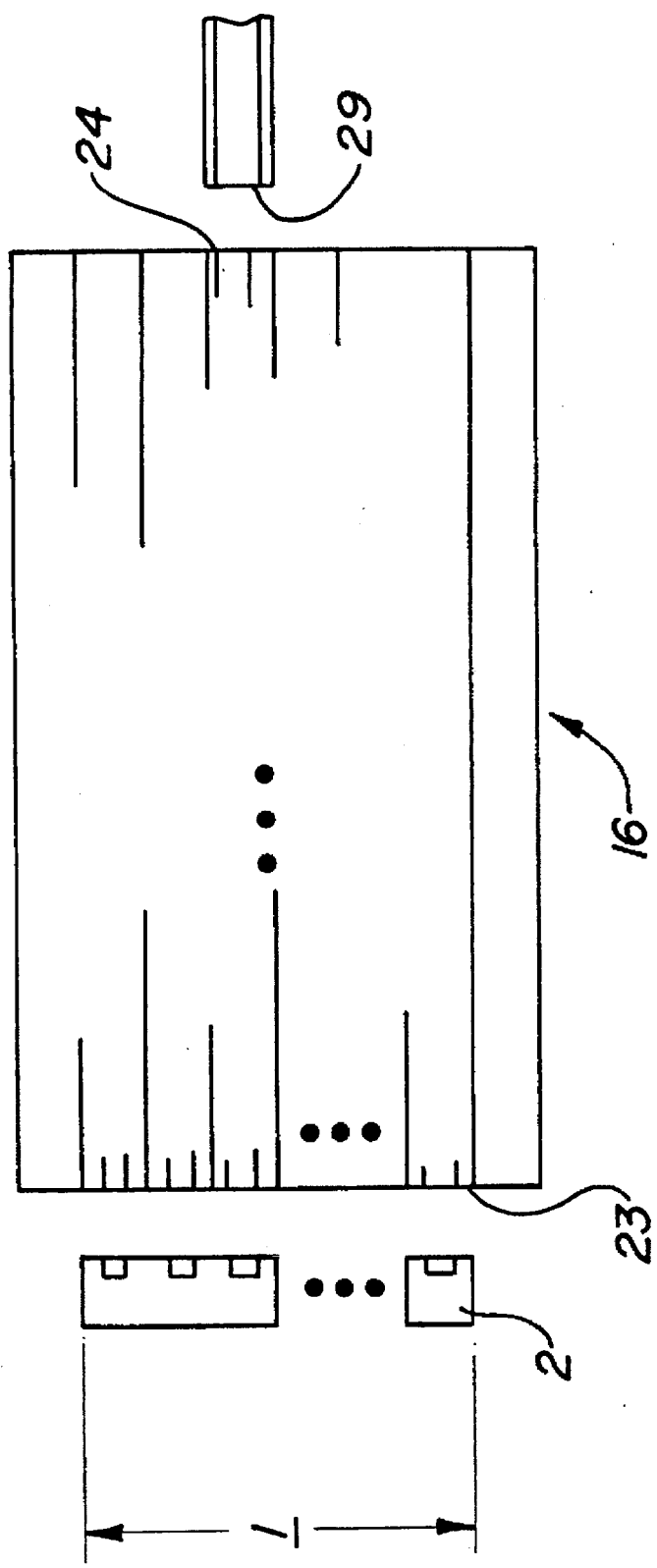

COMPOUND LASER SYSTEM FOR HIGH POWER DENSITIES

REFERENCE TO RELATED CASE

This application is a continuation-in-part of U.S. patent application Ser. No. 08/361,774 filed on Dec. 12, 1994 by Wolfgang Neuberger, inventor, entitled "DELIVERY SYSTEM FOR HIGH POWER DENSITIES FROM DIODE LASERS", now abandoned and incorporated by reference herein.

BACKGROUND OF THE INVENTION

1. Field of the Invention

The present invention relates to lasers and optoelectronics and in particular to new compound optical sources of coherent radiation for generation of high power densities based on summation of the power of few separate laser components by an optical beam combiner. The laser system may be used for combination of beams irradiated by multiple diode lasers or a diode laser array employing beam combining components based on specially configured optical fiber and integrated optical waveguide system to pump optical fiber amplifiers or active crystals in miniature solid state lasers.

2. Information Disclosure Statement

For many industrial and medical uses, the key attribute of a laser system is the power density that can be delivered to a particular site or point. Another desirable aspect of power delivery systems is that the laser's output be delivered to points remote from the laser and without being limited by the lasers physical orientation. Employing inexpensive semiconductor diode lasers instead of standard lasers is preferable for many industrial applications, since these lasers offer simple alignment and can easily be substituted for service or repair, if required. For example, such diode lasers could replace conventional laser sources for welding, cutting and surface treatment or can be used for pumping miniature solid state lasers and optical fiber lasers or amplifiers. The power needed for these applications, however, exceeds the power available from single low-cost diode lasers and has therefore required the use of high cost, high output lasers. Because the targeted applications require power that exceeds that of a single diode laser, one can use an array of diode lasers whose individual beams should be combined by some optical system and then coupled into an active optical fiber or an active crystal.

Such diode lasers, typically rated around 1 W, exhibit output cross sections of 200 µm by 1–2 µm and divergences of 20° and 40° in the respective cross-sectional major and minor axes. The outputs of these individual diode lasers are combined in the present state of the art by capturing each diode laser's output with a standard round optical fiber. The diameter of the core of the individual fibers is chosen such that it will encompass or cover a diode laser's largest output dimension, e.g., in the case of a 200 µm by 1–2 µm output pattern the capturing fiber's core diameter will be 200 µm; with a typical thin cladding this would be at least a 220 µm clad fiber. Typically cylindrical lenses are affixed to the diode lasers or to the end of the individual receiving fibers to reduce beam divergence. Groups of these individual fibers are then combined by being bound together, and packaged in a launch connector.

All optical systems have an inherent phase volume stated by Streibel's invariant, which for circular cross sections is $d^2 \eta \sin\Theta$, where d is the beam diameter, $\Theta$ is the angle of the beam transverse divergence and $\eta$ is refractive index of the medium. Brightness of the beam is proportional to thin invariant and can be increased only by increasing the beam power. The beam power density, however, is inversely proportional to the beam cross section, so an increase in the cross section yields a significant decrease in power density. Since the phase volume cannot be decreased by an optical system, the goal of power delivery system should be the improve in brightness at the output of the system and the increase in beam power by minimizing loss in the system, particularly at system junctions, or the increase in power density by decreasing the beam cross section.

Present systems significantly decrease brightness of a diode laser's output at the coupling between each individual diode laser and optical fiber capturing the diode laser's beam. This is due to the difference in cross-sectional area dictated by the cross-sectional shape and the difference in numerical apertures of the laser and fiber. The diode laser has rectangular-shaped output and different numerical apertures in the directions of both principal axis of the rectangular cross section. The optical fiber used as the receiver has a circular cross-section, with a diameter approximately equal to the longer rectangular axis of the laser's output and matches numerical aperture of the laser only in this direction. Another loss of power and decrease of brightness occurs at the junction between the bundled, individual fibers coming from individual diode lasers and the single standard circular cross-sectional fiber into which the collected output is sent.

FIG. 1 shows the prior art, where a high loss interface 5 occurs between diode lasers 2 and combiner subsystem 6 of round fibers 4, and a second loss interface 8 occurs where the combiner subsystem's output 11 is sent into a receiving port 29 of delivery subsystem 12 having a diameter similar to that of the bundled output. At each of these interfaces the power density decreases due to losses and the increase in cross-sectional area of the receiving fibers. Fiber 13 carries the total captured output of the diode laser array and is considered the deliverable output of the system.

Current art is focused on the problem of minimizing the power loss at the high loss-prone junction between an optical device such as a diode laser and a single round optical fiber. The solutions used in current art focus on the creation of micro-lenses at the end of a round optical fiber to focus the light beam into the fiber, or the insertion of a lens between the source and the fiber to achieve the same purpose. Neither reduces the coupling losses at that junction. U.S. Pat. No. 5,256,851 describes the use of an asymmetric hyperbolic micro lenses on a single mode optical fiber to enhance the coupling efficiency of a diode and a fiber by matching the ellipsoidal ratios of the laser diode and the lens. This improves upon earlier microlenses described in U.S. Pat. Nos. 5,011,254 and 4,932,989. U.S. Pat. No. 5,127,068 teaches how to couple the light from an array of laser diodes into a plurality of bundled optical fibers using a cylindrical microlens made from a small diameter multimode optical fiber. U.S. Pat. No. 4,723,257 describes a laser diode pumped solid state laser comprising an optical fiber transmitting pumping radiation. These approaches are not practical, however, when the output of the diode laser has axial ratios larger than 10:1, as is typically encountered in high-power multimodal diode lasers. U.S. Pat. Nos. 4,818,062 and 4,688,884 describe an optical fiber having improved capability to receive light energy from a diode laser. The fiber has a tapered input end squashed into an elongated cross section to match both the diode laser numerical apertures and its cross section. The squashing of the fiber end can not, however, provide the ratio of the fiber cross dimensions as large as 1:20 required for effective matching to the diode laser. Even in this case the tapered section only serves as yet another optical means to input diode radiation into the final circularly symmetric fiber cross section. Moreover, tapering of the fiber from its elongated end to its round end changes rectangular configuration of the input laser beam which may be undesirable for certain applications. For example, typical diode laser array has irradiates 12 beams of rectangular cross section oriented along its horizontal plane of p-n junction. To recombine these beams in such a way that long axes of all the beams are oriented in the vertical direction one need flexible means to transmit a plurality of the beams without changing of brightness and shape of each of the beams. Therefore, for many practical applications, it is desirable to have means of efficient coupling of the light from diode lasers into optical fibers while preserving brightness and rectangular shape of the light beam irradiated by diode laser over whole the fiber length. To solve this problem, a special beam combiner systems must be designed.

The effective beam combiner is also a key component of many compound laser systems based on constructive superposition of beams generated by a number of individual sources of coherent radiation such as diode or fiber lasers. For example, the output radiation power of semiconductor lasers can be increased, retaining the spatial coherence, by the use of an array of strip structures formed on the same substrate and coupled either directly by the tunnel effect or indirectly by intermediate stripe waveguides. Although the output power can be increased considerably in systems of this kind, the problem of cooling the substrate remains and it has not yet been solved satisfactorily.

In the case of a fiber laser, the output power of the fiber lasers is governed by the pump radiation power coupled into the active fiber material, i.e. it is also limited by the power and spatial coherence of the semiconductor laser usually employed as the pump source.

One technique to achieve high-power laser operation is to spatially separate subgroups of lasers and then coherently combine their outputs.

Corcoran C. J. and Rediker R. H. (Appl. Phys. Lett. v.59, 759 (1991)) have demonstrated a system of five diode gain elements, i.e. semiconductor diode lasers having one facet antireflection-coated, operated as a coherent ensemble by use of an external cavity controlled by a spatial filter or a hologram. The gain elements spatially separated and fiber coupled into the cavity. Collection of the fibers with microlenses on their facets, bulk lenses and spatial filters formed the means for phase-coherent superposing of radiation form the separate lasers in the system. The disadvantages of this system are the bulky design, i.e. the using of a separate optical elements such as lenses, filters, holograms. As a consequence, this reduces the efficiency of summation of output radiation and results in increasing of the threshold of the laser system generation. Moreover, in this system it is difficult to avoid parasitic feedback due to undesirable reflections. When a system of this kind is used, additional devices are needed to concentrate the radiation in a single-mode waveguide channel.

OBJECTS AND SUMMARY OF THE INVENTION

It is an object of the present invention to provide a compound laser system providing high brightness and high power density of the output beam by efficient combination of the beaming generated by a number of individual sources of coherent radiation.

Another object is to provide a simple, compact mad efficient beam combiner performing constructive superposition of the beams generated by individual laser sources.

A further object is to provide efficient method for phase coherent constructive superposition of beams for individual sources by employing a common feedback for all these sources.

Still another object is to optimize the coupling efficiency at the diode laser to optical fiber or optical waveguide junction and provide a means for preserving brightness of the beam over the waveguide length.

A further aim of the present invention is to create a diode laser delivery system which includes a diode laser subsystem, a combiner subsystem that transitions the multiple outputs of the diode lasers into a single output from an optical fiber or optical waveguide and a delivery subsystem.

Still another aim is to create multiple embodiments of the combiner subsystem, including an Integrated Optical Combiner which is a single discrete component containing the full functionality of the entire combiner subsystem.

It is also an aim of the current invention to optimize the power transfer efficiency at the junction between the combined optical fibers or optical waveguides and the single power-delivery optical fiber.

Briefly stated, the present invention provides compound laser system for generating beams of high brightness and high power density by constructive phase coherent combination of the beams generated by a number of individual sources of coherent radiation. It provides a laser system comprising at least two lasers whose output beams are combined by a means for phase-coherent superposing and by a common feedback reflector. In particular, it provides a system for the delivery of high powered output from a set of inexpensive, comparatively low-powered diode lasers comprises three subsystems: a diode laser subsystem which is the source of power for the system; a combiner subsystem which combines the output of the diode lasers; and, an optional delivery subsystem which may be needed to deliver the combined output to its desired destination for industrial or medical applications. The combiner subsystem and the delivery subsystem may use optical fibers, a free-standing form of optical waveguide. These systems may also use captured waveguides. The term "waveguide" is used to cover both free-standing waveguides or optical fibers, and captured waveguides. If only a particular kind of waveguide is to be used, the description "optical fiber" for free-standing waveguides or "capture waveguide" will be used as needed.

The combiner subsystem may be implemented in its entirety as an Integrated Optical Combiner, a single component performing all the combiner subsystem's functions. Each diode laser's output is captured by a single waveguide having a core whose cross-sectional shape is contoured so that its major and minor axes are not less than those of the diode laser output's major and minor axes and having a means to closely match its numerical apertures to that of the laser in the directions of corresponding axes. This means of numerical apertures matching can comprise, for example, some micro optics or shaping the fiber end faces to make a microlens directly on the fiber. The matching cross-sectional shape may also be achieved using a cluster of circular shaped optical fibers where the diameter of each fiber is approximately equal to the minor axis length and a number of such fibers used, side-by-side, is approximately equal to length-of-major-axis divided by the optical fiber diameter.

The waveguides receiving the diode laser's output are called input ports into the combiner subsystem. Waveguides are combined in the combiner subsystem, which contains combiner elements that combhe two or more waveguides into a single waveguide. These combiners are cascaded until there is a single waveguide. This single waveguide is the single combiner subsystem output, called the combiner subsystem output port, whose cross-sectional shape depends on the number and cross-sectional shape if the input ports. A delivery subsystem takes output from the combiner subsystem using a standard round or contoured optical fiber core, depending on the cross-section shape of the combiner subsystem's output.

The combiner subsystem minimizes the power loss at input port interface by the use of input ports whose major and minor axes dimensions closely match those of the diode laser's output. The combiner subsystem's output has a cross-sectional core shape whose major and minor axes dimensions depend on the number and shape of the input ports.

Power loss is minimized at the junction between the combiner subsystem and the delivery subsystem by using optical fiber in the delivery subsystem whose major and minor axes approximate the major and minor axes of the combiner subsystem's output port and whose numerical apertures approximates the numerical apertures of the combiner subsystem.

The above, and other objects, features and advantages of the present invitation will become apparent from the following description read in conjunction with the accompanying drawings.

BRIEF DESCRIPTION OF DRAWINGS

FIG. 2 depicts a cross sectional view of optical fibers with contoured cross-sectional area, with cladding, and depicts the optical inputs used in previous art and in this invention.

FIG. 4 illustrates another embodiment where the combiner subsystem is an Integrated Optical Combiner.

FIGS. 8, 8A and 8B illustrate the integrated Optical combiner based on a fiber having multiple rectangular core.

DESCRIPTION OF PREFERRED EMBODIMENTS

The present invention describes a new compound laser system based on constructive superposition of beams generating by individual sources of coherent radiation.

Figure 1:
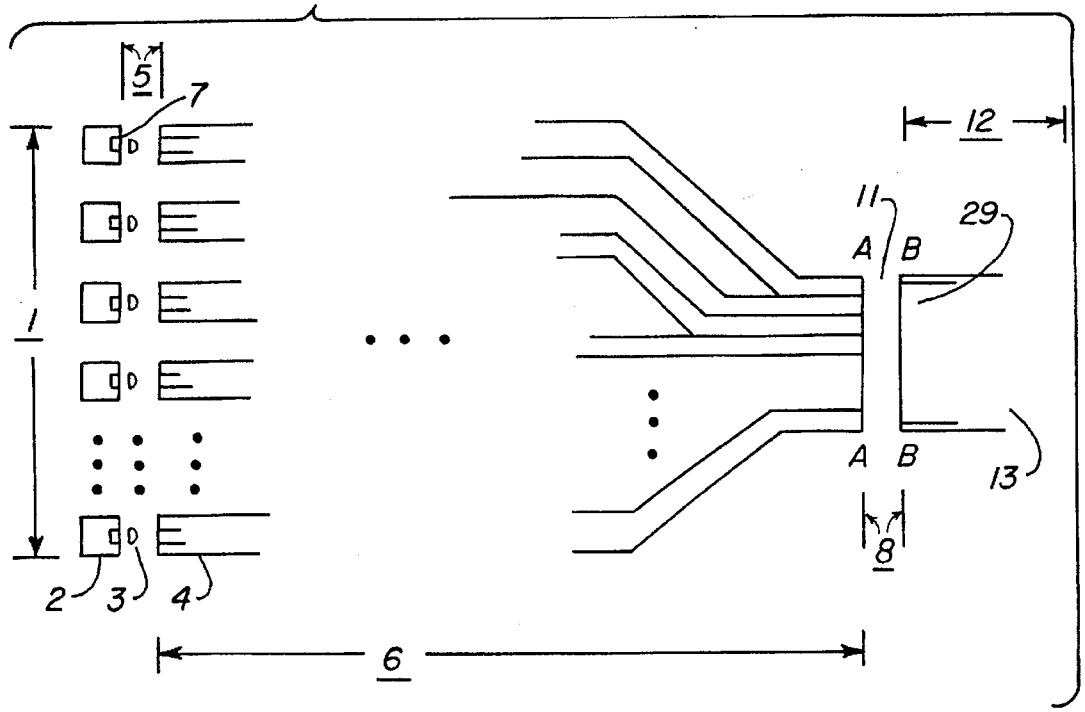
FIGS. 1, 1A and 1B depicts an example of a present state of the art diode laser fiber optic system.
Figure 1A:
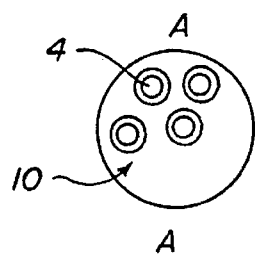
Figure 1B:
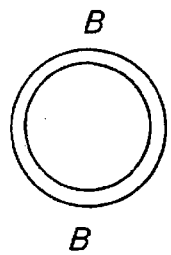

FIG. 1 depicts an example of a present state of the art diode laser fiber optic system Diode lasers 2 are in an array 1. Each diode lasers output passes through lens 3 into a standard optical fiber 4 with circular cross section. The diode laser's output 7, lens 3, and input end of round optical fiber 4 comprise subsystem interface 5. Individual optical fibers 4 continue to a second subsystem interface 8 within combiner subsystem 6. Individual circular cross-sectional fibers are combined into a single circular cross-sectional shape in FIG. 1A. Junction 8 has a cross-sectional area comprised of fibers 4 and significant amounts of inter-fiber space 10. Inter-fiber space 10 indicates a loss of power density at junction 8 as the combiner subsystem's output 11 transfers to delivery subsystem 12. subsystem 12, which uses standard round cross-sectional optical fiber as illustrated in FIG. 1B.

FIG. 2 illustrates two embodiments of the specially-shaped optical waveguide used in the combiner subsystem, having a contoured core 13 and exterior cladding 14. Dimensions of the rectangular fiber core may be, for example, as large as 10×200 or 20×200 μm in order to match cross sections of the fiber and the diode laser. End faces of the fiber can also be shaped to match also the diode laser's numerical apertures in corresponding directions. This results in efficient coupling between the fiber and the diode laser. Fiber cladding has usually much rounder cross section, resulting from its manufacturing process on a draw tower. Also illustrated is the readily apparent difference between optically connecting diode laser 2 output 7 into a contoured core or a standard round-shaped core. The fibers having shaped core described here can be drawn from a preform having corresponding shape. It should be emphasized that these fibers are quite different from the fibers with end squashed into elongated cross section proposed in U.S. Pat. Nos. 4,818,062 and 4,688,884. The fiber drawn from a shaped preform can have the ratio of its core transverse dimensions larger than 1:20, as required to approximate diode laser cross section, while fiber end face can not be squashed to have such large ratio of its principal axes. Moreover, the fiber with shaped core has uniform cross section providing essential conservation of beam brightness and shape over complete fiber length, while the fiber with squashed end has a tapering region changing configuration of the transmitted laser beam. This may be undesirable for some specific applications. For example, in the case when beams from typical diode laser array having rectangular cross sections oriented along the horizontal plane of p-n junction should be recombined in such a way that long axes of all the beams are oriented in the vertical direction, one need a flexible means to transmit and reconfigure a plurality of the beams without changing of brightness and shape of each of the beams.

In addition, the fiber having shaped core possesses an important ability to essentially preserve the state of polarization as the light propagates through the fiber. For example, we have experimentally test a rectangular core fiber excited by a linearly polarized laser diode. The degree of polarization of the light measured at the distal end of the fiber was found to be 0.61. Thus, the flexible Integrated Optical Combiner based on the fibers having shaped core provides unique possibility for pumping of different active media with powerful light beam having certain degree of polarization. The polarization properties of the pump laser beam are potentially very important for diode pumping.

Figure 3:
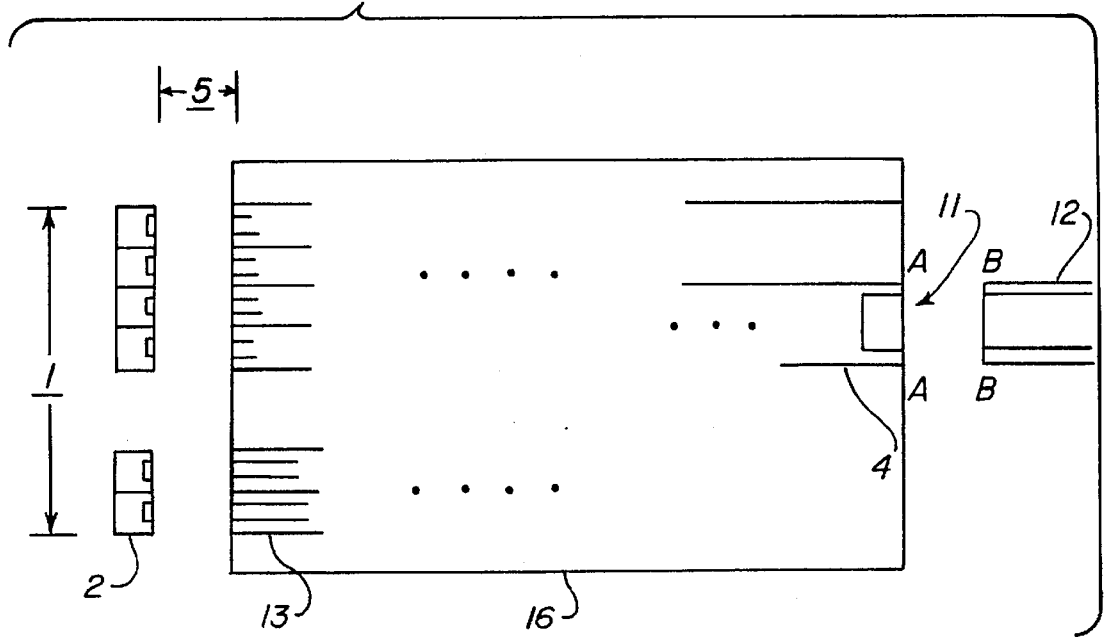
FIGS. 3, 3A and 3B illustrate one preferred embodiment of the present invention.
Figure 3A:
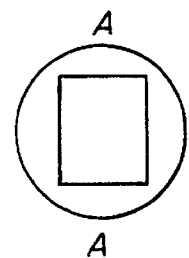
Figure 3B:
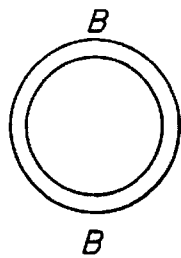

FIG. 3 illustrates one preferred embodiment of the present invention with each diode laser 2 in diode laser array 1 emitting into a specially-shaped optical waveguide 13. Subsystem interface 5 may use a lens to reduce the degree of divergence in the highest-divergence axis, the minor axis, from a typical value of 40° to a value close or the same as the divergence in the low-divergence or major axis, 20°. Subsystem interface 5 may also use waveguides whose input ends are lens-shaped to achieve the same divergence-reduction purpose. Combiner subsystem 16 combines incoming waveguides into a single waveguide. Output port 11 is comprised of an optical waveguide 4 which has a contoured core, as illustrated in FIG. 3A, with cross-sectional shape depending on the number and shape of the input waveguides. For example, 8 input waveguides designed to capture the output of diodes with rectangular cross-sectional shape having a major axis of 200 µm and a minor axis of 10 µm would have a rectangular shaped cross-sectional output port with a major axis of 200 µm and a minor axis of 80 µm. Combiner subsystem's 11 output is fed into delivery subsystem 12 which may use standard round cross-sectional optical fiber as illustrated in FIG. 3B, or may use contoured optical waveguides whose core has major and minor axes approximating those of the combiner subsystem's output and having a means to mutually match corresponding numerical apertures.

FIG. 4 illustrates another preferred embodiment of the present invention where diode laser array 1 is matched to combiner subsystem 16 that is a discrete unitized component called an Integrated Optical Combiner. Each diode laser 2 in diode laser array 1 is aligned with one Integrated Optical Combiner input port 23. Integrated Optical Combiner input ports 23 are contoured. Integrated Optical Combiner Subsystem 16 combines multiple input ports 23 to one output port 24, whose cross sectional shape is approximately square or rectangular, depending on the number and shape of input ports 23. Output port 24 is optically connected to delivery subsystem input port 29, comprised of a standard round optical fiber or a single ellipsoidally shaped optical waveguide whose major and minor axes approximate those of output port 24.

Figure 5:
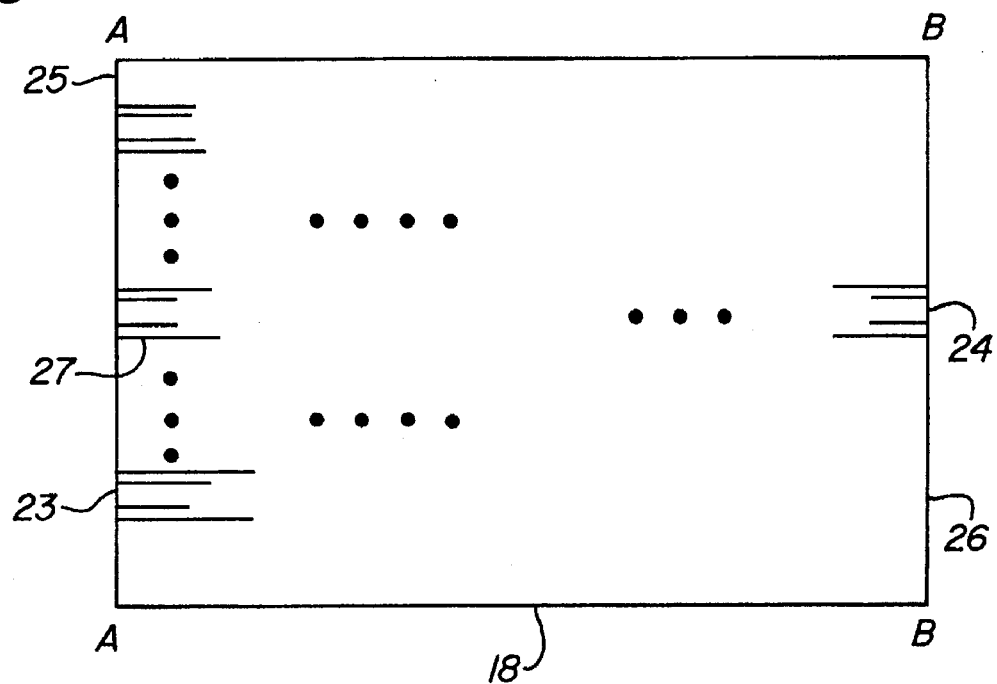
FIGS. 5, 5A and 5B illustrate an embodiment of the Integrated Optical Combiner Subsystem.
Figure 5A:
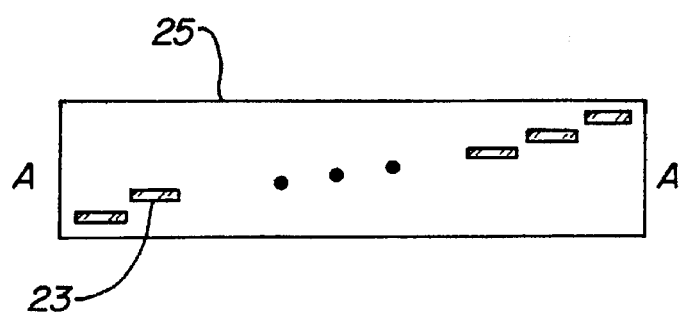
Figure 5B:
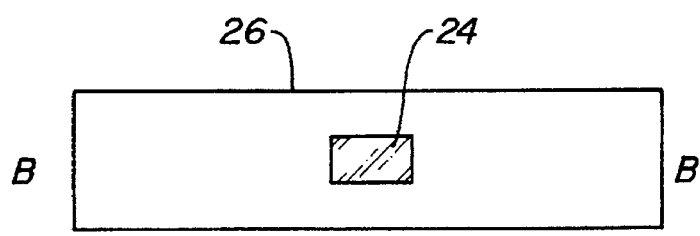

FIG. 5 illustrates one preferred embodiment of Integrated Optical Combiner 18, where input ports 23 of optical waveguides 27 are contoured in cross-sectional shape. Input ports 23 are staggered or stair-stepped, such that in viewing, input port side 25 of Integrated Optical Combiner 18 each rectangularly-shaped input port has its major and minor axes parallel to the major and minor axes, respectively, of input port side 25, and each successive input port going from left to right has its bottom flat edge slightly above the previous port's top flat edge as shown in FIG. 5a. A left-most input port is located near the bottom left corner of input port side 25 of Integrated Optical Combiner 18, and a right most input port is located near the top right corner of input port side 25 of Integrated Optical Combiner 18. Output port 24 is located on the opposite side of Integrated Optical Combiner 18 as input ports 23. Output port 24 has its major and minor axes parallel to the major and minor axes, respectively, of output side 26. Output port 24 has an approximately square-shaped core or a rectangularly-shaped core, depending on the FIG. 5b. Integrated Optical Combiner 18 is a body (enclosure) molded, formed, built up, layered, or otherwise manufactured to provide internal channels and voids into which waveguides 27 that perform the functions of the functions of the combiner subsystem are placed. Waveguides 27 in Integrated Optical Combiner 18 can be laid in, layered in, built up, poured in, clamped in, or otherwise set and held in place during the manufacturing process.

Figure 6:
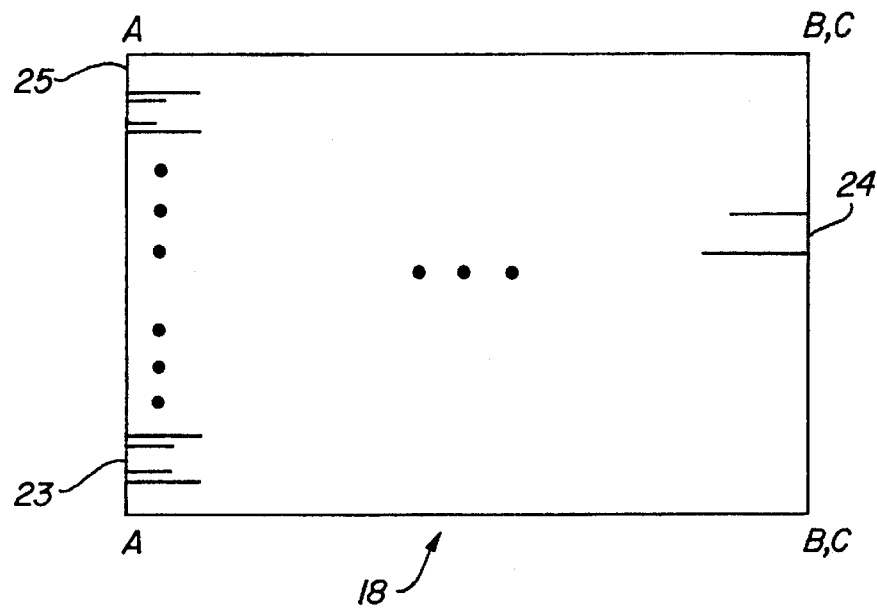
FIGS. 6, 6A and 6B illustrate another embodiment of the Integrated Optical Combiner Subsystem.
Figure 6A:
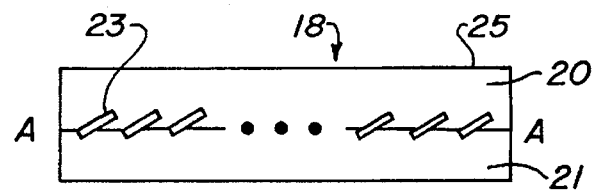
Figure 6B:
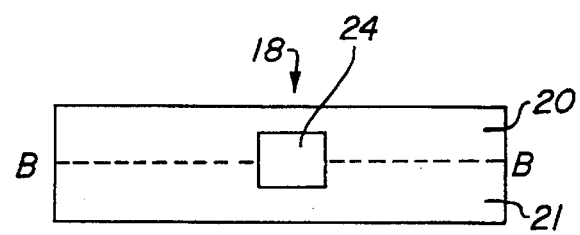
Figure 6C:
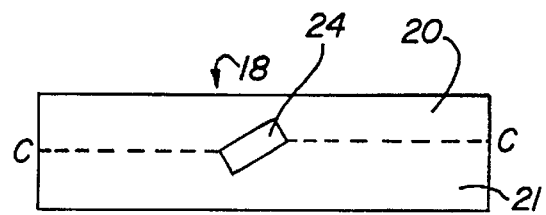

FIG. 6 illustrates another preferred embodiment of Integrated Optical Combiner 18 where input ports 23 have their cross-sectional major and minor axes rotated relative to the major and minor axes of input port side 25 of Integrated Optical Combiner 18. The rotation allows the internal channels and chambers of the Integrated Optical Combiner to be manufactured using cutting or molding technologies in upper body 20 and lower body 21 of Integrated Optical Combiner 18. Output port 24 may also have its major and minor axes rotated relative to the major and minor axes of output port side 18. See also FIGS. 6A, 6B and 6C. Upper body 20 and lower body 21 can be clamped, heated, glued, or otherwise forced or held together during manufacturing.

A preferred embodiment for a set of diode lasers when an Integrated Optical Combiner like that illustrated in FIG. 6 is used is to rotate the major and minor axes of the individual laser diodes so that their output shape rotates the same mount as the axes rotation of the input ports in the Integrated Optical Combiner. This embodiment may also allow the diode lasers to be more tightly packaged than non-rotated arrays.

Another preferred embodiment of an Integrated Optical Combiner has both axes of the input ports parallel to the major and minor axes of the Integrated Optical Combiner's input port side. The input ports are stepped in an up and down fashion going from left to right along input port side. The stepping allows an Integrated Optical Combiner's height to be no more than a specified number of input ports high by adding more ports along the input port aide's major axis. The output port will have a contoured core whose shape is a result of combining differing numbers of input ports with differing major and minor axes.

Figure 7:
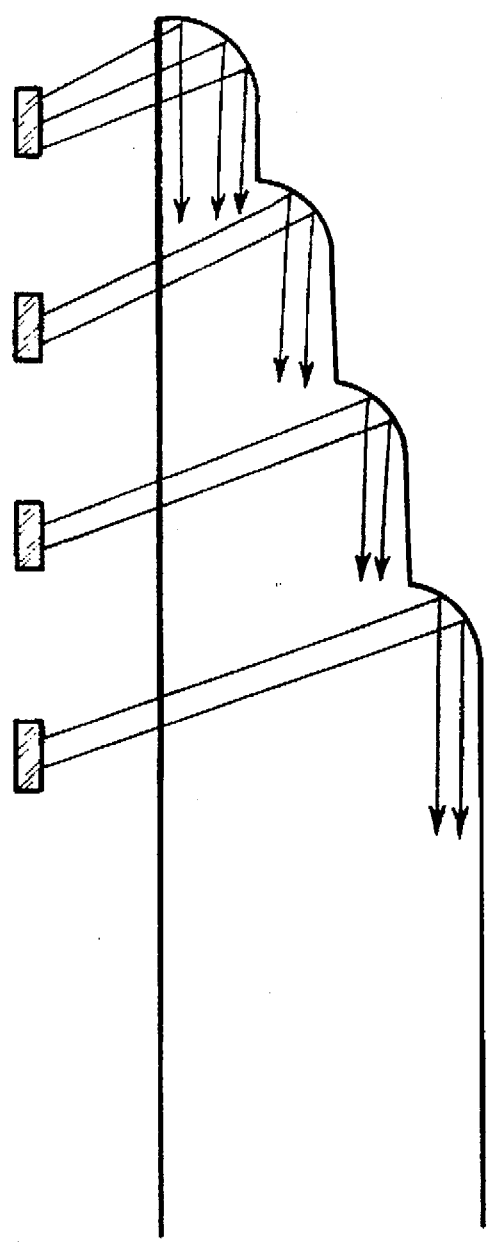
FIG. 7 illustrates still other embodiment of the Integrated Optical Combiner.

FIG. 7 illustrates still another preferred embodiment of an Integrated Optical Combiner which comprises at least one optical fiber 76 having one flat side surface 78 and one side surface of such a shape 74 that the light irradiated by each diode laser 72 through flat side surface 78 is reflected and focused by shaped side surface 74 in the direction parallel to the axis of optical fiber 76 collecting light emitted from all diode lasers 72.

Figure 8:
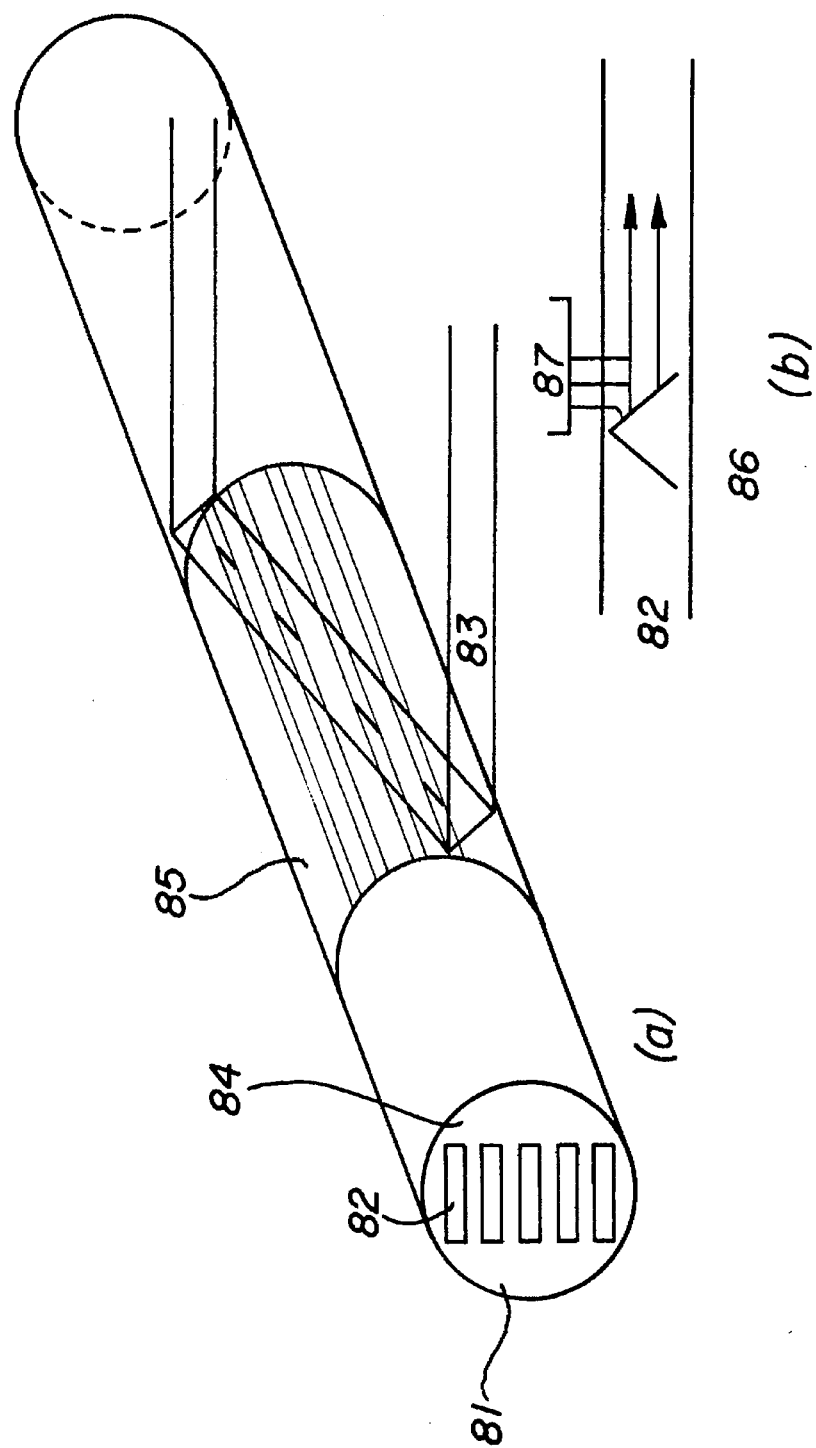

FIG. 8a shows a schematic of another Integrated Optical Combiner employing special having multiple rectangular core. An optical fiber 81 has a plurality of cores 82 having rectangular cross sections. The number of these cores is equal to the number of active regions of laser diode array 83. It typical case it is equal to 12. Fiber 81 has cladding 84 which is side removed in the region 85 where laser diode array 83 is butt-joined to fiber 81. To remove the cladding from one side of the fiber, one can, for example, polish the fiber in a special glass block. Laser diode array 83 should be butt-joined to the fiber 81 under some angle to the fiber axis to ensure effective overlapping of each active element of the array with cross section of the corresponding fiber core. This provides effective coupling of light from diode array into the fiber cores. Each fiber core has a means to reflect the side coupled light in the direction along the fiber axis. Appropriate incisions 86 made in the fiber cores 82 can be used for reflection of the light irradiated by laser diode 87, as shown in FIG. 8b. These incisions can be fabricated for example, with the help of focused beam of $CO_2$ laser, excimer laser or other micromachining techniques.

The preferred embodiments show the advantages in using this inventions' solutions instead of previous implementations. The interfaces to the combiner subsystem have been improved through the creation and use of input ports whose cross-sectional shape and major and minor axes are close to the cross-sectional shape and major and minor axes of the components with which they interface and having means to match numerical apertures of the input ports and the components. In the case of a set of diode lasers, each diode laser is matched to a combiner subsystem intake port whose cross-sectional shape is appropriately contoured to have the major and minor axes dimensions not smaller than that of the output of the laser. In addition to creating an efficient interface, it may eliminate the need for the lenses used in previous systems when the input ends of the contoured waveguide is shaped so as to reduce the beam divergence in the diode laser's highest-divergence axis (the minor axis) to that of the low-divergence axis (the major axis). At the output side of the combiner subsystem, the output port has a cross-sectional shape approximately that of a square or of a rectangle, depending on the number of laser diodes and characteristic output shape of each diode. The input port's shape of the delivery subsystem may be designed to closely match the combiner subsystem's output port shape. This may be a standard circular cross-sectionally shaped core or may be a special contoured core.

A calculation can be made of the potential efficiency gain between this invention and the previous art. The comparison is made between the current invention's matching of a typical diode laser's output shape of 200 µm by 10 µm, coupled with the use of a divergence-reducing lens or lens-shaped fiber ends, relative to the previous art using an optical fiber whose core was circular in cross section and whose diameter was 200 µm. The power densities of both systems at an equal distance into the combiner subsystem from the point of issue would be related to each other as:

$$(200^2(\pi/4))/(200(10))=15.7$$

This shows that the current invention can easily deliver power densities over an order of magnitude higher using the same diode laser source.

Additionally, this invention discloses an Integrated Optical Combiner, a discrete component which is the combiner subsystem of a diode laser array power delivery system. The Integrated Optical Combiner allows significant savings in manufacturing to be realized over previous art by reducing the discrete component count on each board, increases ease of manufacturing, and increases reliability by reducing the component count in the entire system.

The laser diode sources of radiation considered above in detail are only one example of active elements that can be employed in high power compound laser system based on superposition of beaming generated by a number of coherent sources. Any active elements generating coherent radiation can generally be employed in the compound laser system. For example, this system can use active fiber lasers or amplifiers as active elements. Optical parametric amplifiers or oscillators based on frequency conversion in nonlinear material pumped with an external laser beam can also be employed as the active elements of the compound laser system.

Special Phase Coherent Integrated Optical Combiner is a key component of the high power compound laser system. Its main function is to provide constructive superposition of coherent beams generated by all active elements of the compound laser system.

Figure 9:
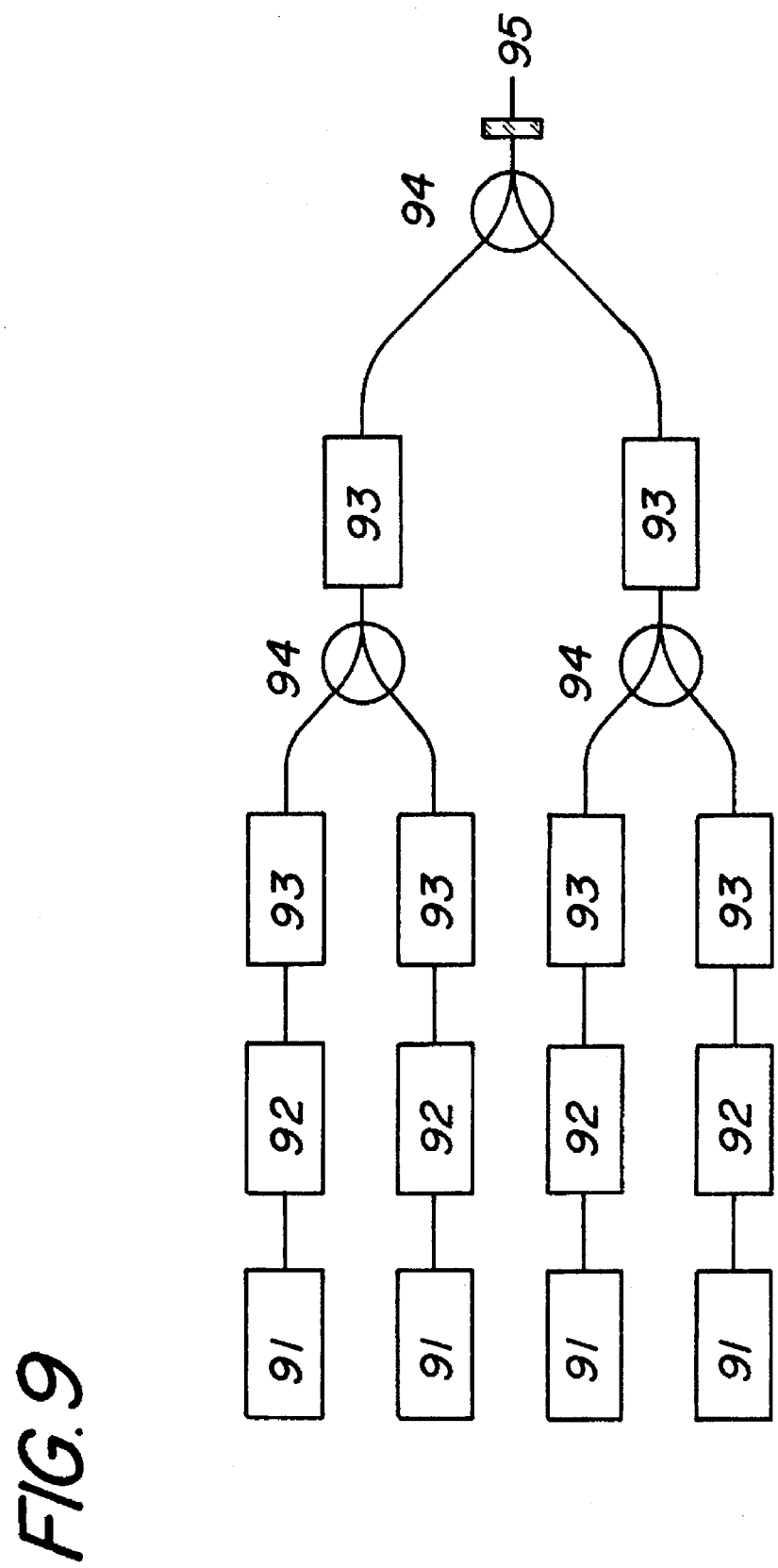
FIG. 9 shows an example of the use of optical fiber Y junctions for coherent constructive combination of radiation from four lasers.

One preferred embodiment of the system is shown in FIG. 9. Light beams from four individual active elements 91 are coupled into single-mode fibers with polarization rotators 92 and phase modulators 93. The fibers are spliced together with the help of Y-junctions providing their cascade connection. Each active element 91 has an internal means of optical feedback. In the case of lasers used as active elements, rear mirror or Bragg reflector of the laser can provide the means of internal optical feedback. In the case of optical parametric oscillator based on counterpropagating signal and idler waves, coupling between these signal and idler waves can provide the means of internal feedback.

Output fiber has a means of external optical feedback which can be provided by a reflecting coating of the fiber facet, a mirror or a Bragg reflector. Feedback in the system ensure coherent adding of the radiation in compound laser system comprising of four active elements 91.

The laser system operates as follows. The radiation reflected from exit mirror 95 passes through cascaded Y-junctions, uniformly distributes among the active elements 91, amplifiers under double path through them and returns to the inputs of Y-junctions. Let $I_1$ and $I_2$ are the intensities of radiation arriving at the inputs of each of Y-junction and let $\Delta\phi$ is the phase difference between them. The intensity at the output of Y-junction is $$I=(I_1+I_2+2(I_1I_2)^{1/2}\cos\Delta\phi)/2 \tag{1}$$

The output intensity reaches its maximum value when the following two conditions are satisfied: $I_1=I_2$ and $\Delta\phi=0$. This case corresponds to summation of the radiation intensities in Y-junction without any losses. If similar conditions are satisfied by all Y-junctions, this results in the minimum value of the lasing threshold of the system However, if incoherent radiation reaches the inputs of the Y-junctions, then the power losses in each of them amount to 3 dB, and this regime of operation of the laser system is characterized by a much higher threshold. The first condition of equality of the intensities can be satisfied by suitable pumping of the individual active elements. However, the second condition, $\Delta\phi=0$, can be satisfied only if, first, the radiation in the various arms of the system is mutually coherent and, second, if the optical path difference between these arms is a multiple of an integer number of wavelength. The last condition can be satisfied by tuning phase modulators 93 in each arm or by choosing very different optical lengths of the arms because the longitudinal modes are then selected in the laser system and the radiation with required wavelength is generated automatically.

The proposed approach can be used, in particular, to add the powers of individual semiconductor laser diodes and of several fiber lasers having separate pump sources. As a result, the output radiation is concentrated in a single output fiber, which makes it most convenient for any further use.

Figure 10:
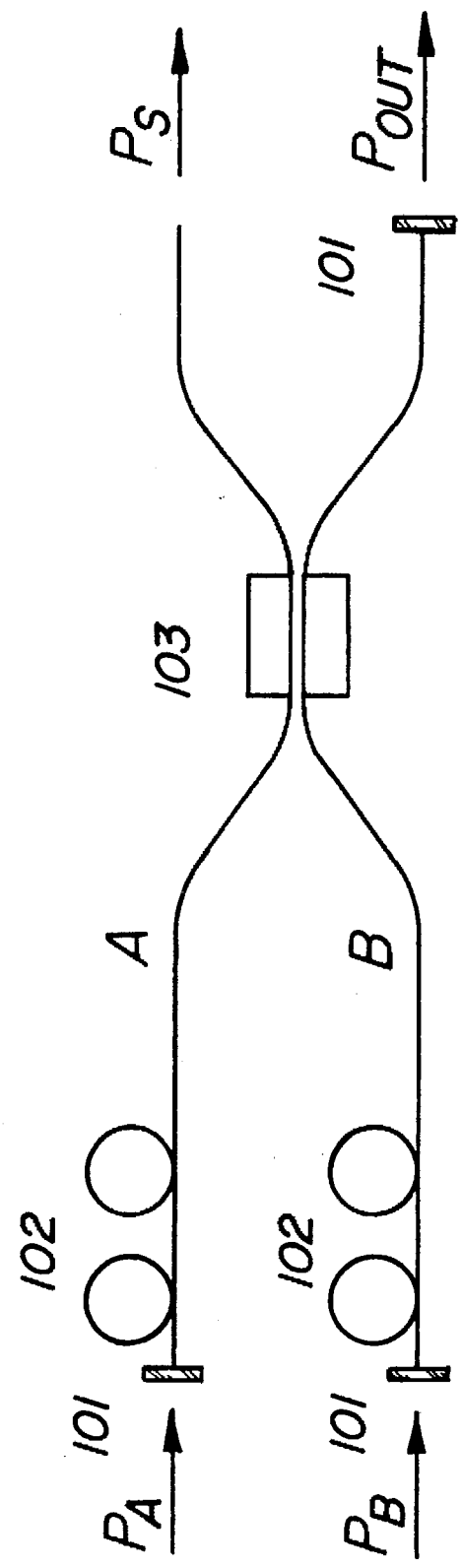
FIG. 10 shows schematic of the experimentally investigated compound laser system.

In a model experiment we used an all-fiber laser system shown in FIG. 10. The system comprised of two separate active fibers A and B doped with $Nd^{3+}$ in a relative concentration of $10^{-3}$. This fibers are single-mode at the lasing wavelength of 1.08 µm. They are connected by an X-type junction formed from sections of the two fibers (polished down to the core) which could be moved relative to one another by a micropositioner. The use of such a junction avoided completely the optical losses in the coupling region and enabled us to alter the coefficient representing the division by the junction. We were also able to record the power of the uncompensated radiation $P_s$ at free output of the junction (in the case of Y-junction such radiation would have been scattered at the output). The three other arms (channels) of the junction were brought into contact with dielectric mirrors 101 whose reflection coefficients at the lasing wavelength were 95%. The length of the active arm A of the system was 0.9 m and the length of the arm B was 1 m. This ensured a practically complete absorption of the radiation from an Ar laser (having wavelength $\lambda=514$ nm) which was used as a pump and the difference between the arm lengths was sufficient to satisfy automatically the phase relationships governing lasing in the system. The output part of the fiber shared by both arms was about of 25 cm long. The active fibers were excited through their ends. Each arm of the laser system was pumped independently and the pump power could reach 20 mW in each arm. Two fiber polarization controllers were used to achieve maximum constructive (in the shared output arm of the X-junction) or destructive (in the free arm of the junction) interference. The experiment has demonstrated 95% efficiency of radiation power addition in the system.

Cascaded Y-junctions shown in FIG. 9 are not the only possible embodiment of the Phase Coherent Integrated Optical Combiner. Many of the Integrated Optical Combiners described above can be employed in the Phase Coherent Integrated Optical Combiner, if appropriate external feedback is provided. It is essential for operation of the compound laser system to provide efficient coupling between laser and light delivering waveguide in both directions. This is important condition for establishing external feedback required for operation of the system. This point becomes really critical in the case of the coupling between diode lasers and fibers as a result of the difference in their geometries. It seems that Integrated Optical Combiner based on fibers having shaped core described above in detail offers a unique solution of the problem.

Figure 11:
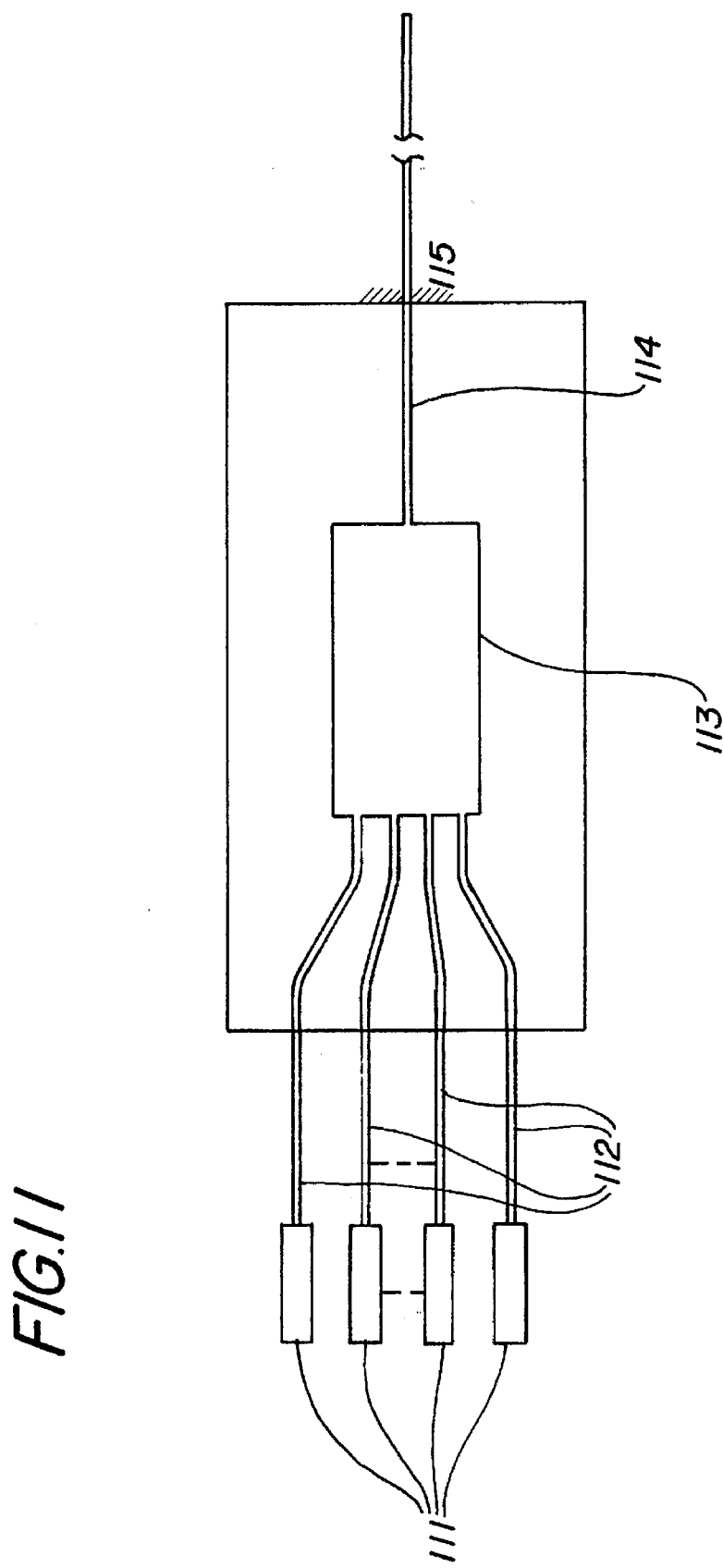
FIG. 11 shows schematic of compound laser system employing a section of multimode waveguide as Phase Coherent Integrated Optical Combiner.

An additional preferred embodiment of the compound laser system employing the Phase Coherent Integrated Optical. Combiner based on a section of a multimode waveguide operating as an interference combiner is shown in FIG. 11. Light from four active elements 111 is delivered by waveguides 112 to Phase Coherent Integrated Optical Combiner 113 performing adding of powers of the individual incoming beams and coupling the light into output waveguide 114. Mirror 115 provides an external feedback in the system.

Figure 12:
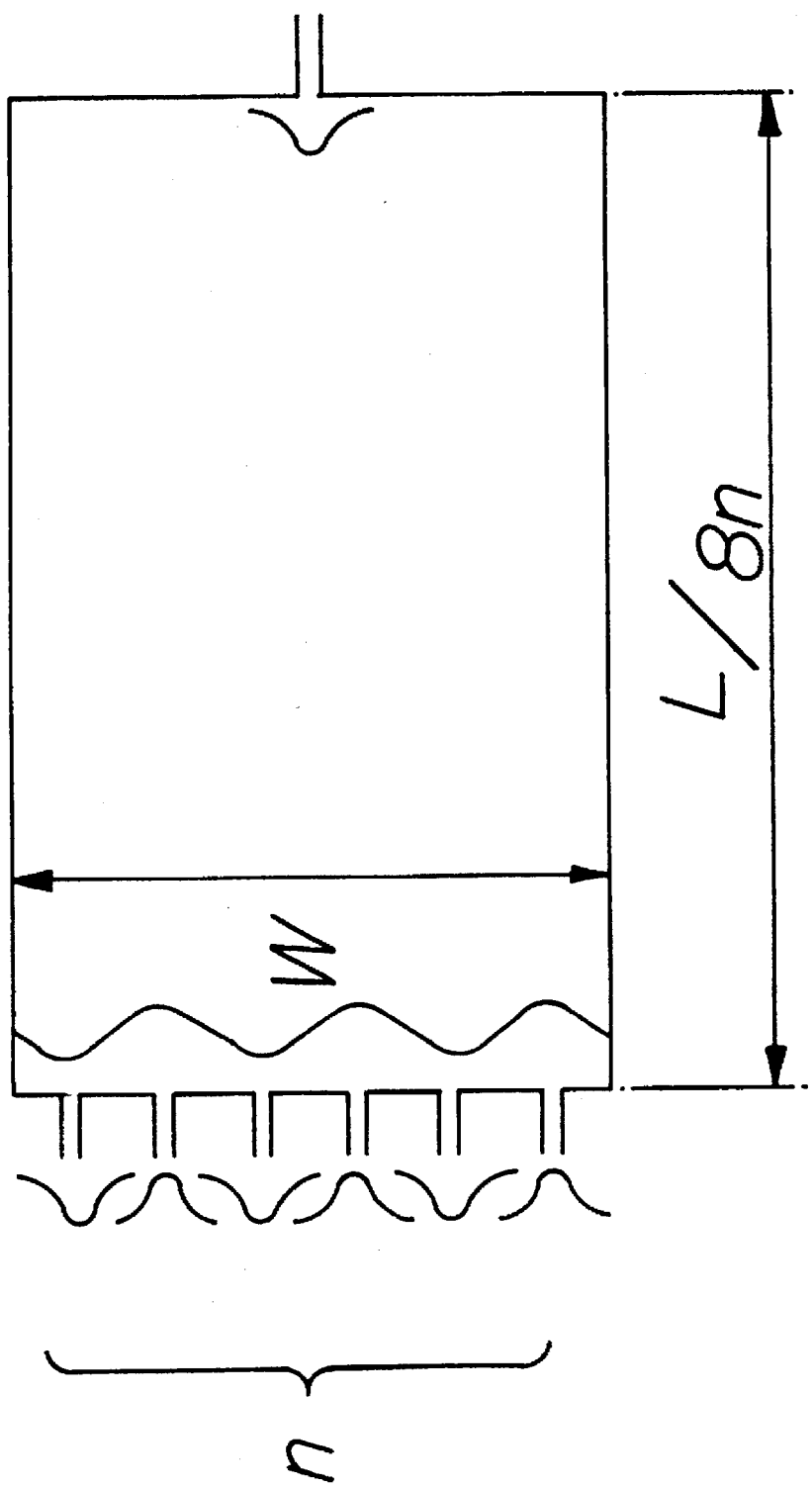
FIG. 12 shows a section of multimode waveguide operating as a interference combiner.

Operation of the section of multimode waveguide as an interference beam combiner is illustrated in FIG. 12. It is known that section of multimode waveguide whose width W is large enough to support many lateral modes can operate as a beam splitter. Self-images of the waveguide input occur in planes at distance L from the input in which the accumulated phase difference between excited modes are multiples of $2\pi$. Multiple self-images are formed at intermediate planes. If the length of multimode waveguide section is equal to $L/8\pi$, then an input beam which is central fed is nearly uniformly split among n output waveguides. Back propagation of appropriately phased n input beams results in coherent combining their powers in one output beam: Feedback means 115 shown in FIG. 11 provides conditions for automatically phasing of all the beams required for operation of Phase Coherent Integrated Optical Combiner.

Figure 13:
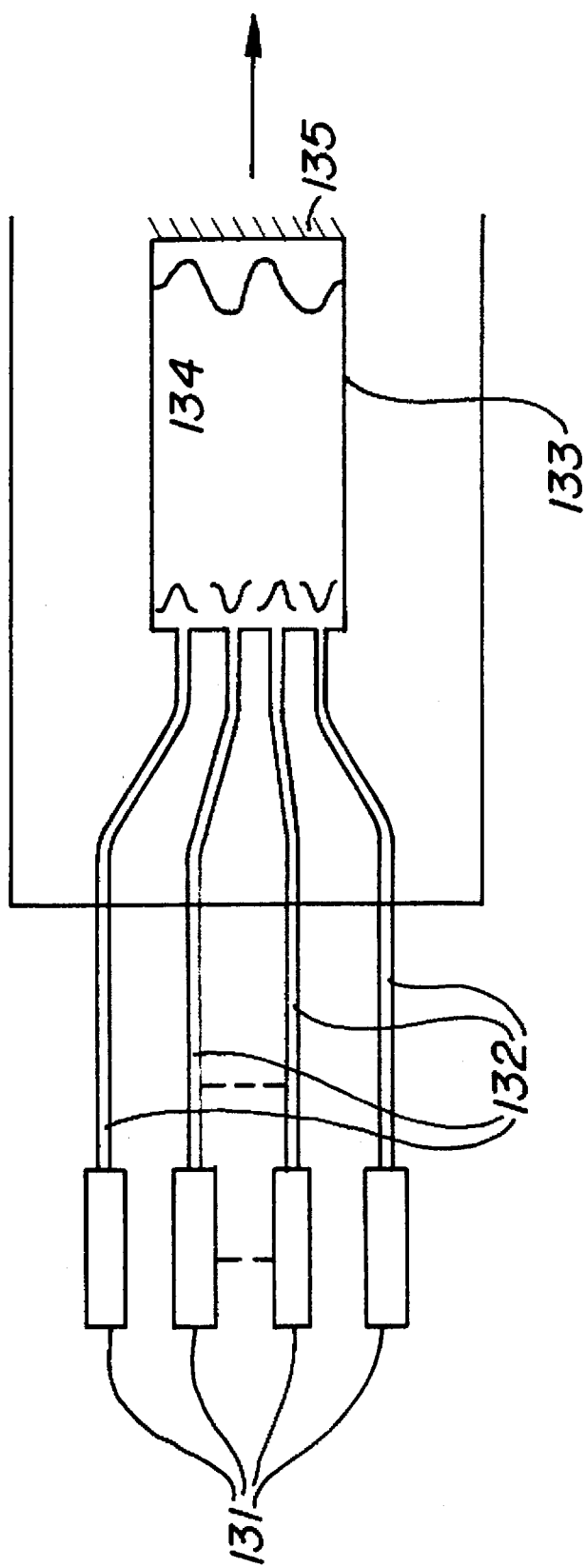
FIG. 13 shows schematic of compound laser system for generation a single higher order mode.

For some practical applications it is desirable to have a compound laser system generating a powerful output beam corresponding a higher order mode of the multimode waveguide. Such compound laser system is shown in FIG. 13. In this case the section of multimode waveguide should not have a specific length. Input beams having appropriate relative phases excite an output beam corresponding to higher order mode 134 in the multimode waveguide. Feedback means 135 automatically provides required phase relations between all input beams.

Different types of optical waveguides can be employed in the Phase Coherent Integrated Optical Combiner described above. In one preferred embodiment one can design this Combiner based on integrated optical rib waveguides connected to a section of planar multimode waveguide being fabricated on the same substrate. A section of multimode optical fiber can also be used in such a Combiner. Another preferred embodiment used a section of a multimode optical fiber having rectangular cross section. For using this fiber in combination with single-mode light delivering input/output fibers, it may be convenient to use the rectangular fiber core of such size that the rectangular core fiber is single mode in one direction and multimode in another direction.

Having described preferred embodiments of the invention with reference to the accompanying drawings, it is to be understood that the invention is not limited to the precise embodiments, and that various changes and modifications may be effected therein by skilled in the art without departing from the scope or spirit of the invention as defined in the appended claims.

What is claimed is:

1. A flexible compound laser system comprising:
   a diode laser subsystem having at least two diode lasers or an array of diode lasers whose output is non-circular in shape and generally have an astigmatic numerical aperture;
   an optical combiner subsystem;
   a set of optical waveguides for optically connecting said diode laser subsystem to said optical combiner subsystem with each diode laser in said laser subsystem having its output captured by an optical waveguide;
   said optical waveguide having a core cross section that is contoured in shape to match a cross section of a beam irradiated by said diode laser and functioning as an input port of said combiner subsystem;
   said optical waveguides having shaped ends or lenses on an end facing said diode lasers to substantially approximate numerical apertures of said diode laser's beam in both its major and minor axes;
   said optical combiner subsystem combining individual beams from said optical waveguides capturing said diode laser output into a single output, wherein said single output has a geometry that is substantially a superposition of said input waveguides, allowing said output to substantially maintain an initial input power density; and
   means for delivering said output.

2. A compound laser system according to claim 1, wherein said optical combiner subsystem is an integrated single component, said component being an Integrated Optical Combiner, further comprising:
   a body, generally having sections to be mated during manufacturing;
   channels and voids in said body;
   optical waveguide material in said channels and voids;
   input ports comprised of optical waveguide material whose core cross-sectional shape substantially matches said laser diodes' output shape;
   an output port comprised of optical waveguide material whose cross-sectional shape is contoured to be substantially, geometrically equivalent to superimposing said core cross-sectional shapes of said input ports, allowing said output port to substantially maintain an initial input power density, brightness;
   an Integrated Optical Combiner input port side of said body where said input ports are located; and
   an Integrated Optical Combiner output port side of said body where said output port is located.

3. A compound laser system according to claim 2, wherein said input ports in said Integrated Optical Combiner are arranged to be substantially aligned with said diode lasers such that each input port is substantially aligned with one diode laser output.

4. A compound laser system according to claim 2, wherein said Integrated Optical Combiner is comprised of two halves, an upper half and a lower half, where mating surfaces of each half are formed and machined such that said channels and voids are formed when said halves are assembled, said input ports have their major and minor axes rotated relative to major and minor axes, respectively, of said Integrated Optical Combiner input port side, and said output port has its major and minor axes rotated relative to major and minor axes, respectively, of said Integrated Optical Combiner output port side.

5. A compound laser system according to claim 2, wherein Integrated Optical Combiner comprises at least one optical fiber having one flat side surface parallel to its longitudinal axis and one side surface of such shape that light irradiated by each diode laser through said flat surface is reflected by said shaped side surface in a direction of said longitudinal axis of said fiber collecting said light from all said diode lasers, facing said fiber's flat side.

6. A compound laser system according to claim 2, wherein said Integrated Optical Combiner comprises:
   at least one multicore optical fiber having a low index of refraction cladding surrounding at least two cores of rectangular cross section;
   said cladding being removed from one side of said fiber in a region where said fiber is butt-joined to a diode laser array comprising at least two individual diode lasers;
   light beams irradiated by each of said individual diode lasers are coupled into a corresponding of said multi-core fiber; and
   each of said cores of said multicore fiber has means for reflecting said beams in a direction along said fiber's longitudinal axis.

7. A compound laser system according to claim. 1, wherein said means of delivering said output is a delivery subsystem comprising:
   an input side which is an optical waveguide whose cross-sectional core shape is a standard round shape or is contoured, generally having a lens between said output of said combiner subsystem and said delivery subsystem input side;
   an output side; and
   if said output of said combiner subsystem is not circularly symmetrical said delivery subsystem input side having a specially-shaped end whereby emissions divergence from said combiner subsystem output is equalized between said combiner subsystem output's major and minor axes.

8. A compound laser system according to claim 1, wherein said waveguides are individual optical fibers and said combiner subsystem comprises a cascade-like arrangement of optical fiber combiners.

9. A compound laser system comprising:
   at least two active elements selected from a group consisting of lasers and amplifiers, which enhance power of an optical beam from each active element, and have at least one means of internal optical feedback for each active element;
   active elements are selected to be optical parametric amplifiers which are based on frequency conversion in a nonlinear medium pumped with an external source;
   said means of internal optical feedback is selected from a group consisting of at least one mirror, a Bragg reflector inside of said nonlinear medium of said optical amplifier, a Bragg reflector at a surface of said nonlinear medium of said optical amplifiers, means for coupling between signal and idler waves in said nonlinear medium where said optical parametric amplifiers have a counterpropagating wave configuration;
   said active elements having means of optical connection of said optical beams to a phase-coherent combiner;
   said phase-coherent combiner constructively superimposing said optical beams to add their intensities, essentially preserving their initial brightness; and
   said phase-coherent combiner having a means of external optical feedback for all said active elements.

10. A compound laser system comprising:
    at least two active elements selected from a group consisting of lasers and amplifiers, which enhance power of an optical beam from each active element, and have at least one means of internal optical feedback for each active element;
    said group of lasers and amplifiers including optical parametric amplifiers, semiconductor lasers, integrated optical micro-lasers, integrated optical micro-amplifiers, optical fiber lasers, optical fiber amplifiers and diode, and diode laser arrays;
    said active elements having means of optical connection of said optical beams to a phase-coherent combiner;
    said phase-coherent combiner constructively superimposing said optical beams to add their intensities, essentially preserving their initial brightness;
    said phase-coherent combiner having a means of external optical feedback for all said active elements;
    said means of optical connection and said phase-coherent combiner are integrated optical waveguides fabricated on a common substrate; and
    said means of external feedback is a Bragg reflector at the output side of said phase-coherent combiner.

11. A compound laser system according to claim 10, wherein said integrated optical combiner includes cascaded Y-junctions having a single output or a section of a multimode optical waveguide.

12. A compound laser system comprising:
    at least two active elements selected from a group consisting of lasers and amplifiers, which enhance power of an optical beam from each active element, and have at least one means of internal optical feedback for each active element;
    said group of lasers and amplifiers including optical parametric amplifiers, semiconductor lasers, integrated optical micro-lasers, integrated optical micro-amplifiers, optical fiber lasers, optical fiber amplifiers and diode, and diode laser arrays;
    said active elements having means of optical connection of said optical beams to a phase-coherent combiner;
    said phase-coherent combiner constructively superimposing said optical beams to add their intensities, essentially preserving their initial brightness;
    said phase-coherent combiner having a means of external optical feedback for all said active elements;
    said means of optical connection are optical fibers;
    said phase-coherent combiner being a cascaded Y-junctions made from optical fibers and having a single output; and
    said means of external feedback includes a mirror or Bragg reflector at said output of said cascaded fiber Y-junctions.

13. A compound laser system comprising:
   at least two active elements selected from a group consisting of lasers and amplifiers, which enhance power of an optical beam from each active element, and have at least one means of internal optical feedback for each active element;
   said active elements are selected to be a diode laser array;
   said means of internal feedback being mirrors of each individual laser of said diode laser array;
   said active elements having means of optical connection of said optical beams to a phase-coherent combiner;
   said phase-coherent combiner constructively superimposing said optical beams to add their intensities, essentially preserving their initial brightness;
   said means of optical connection being optical fibers having a rectangular input cross section of their core;
   said phase-coherent optical combiner being a cascaded Y-junction of said optical fibers;
   said Y-junction being optically connected to an output fiber of round cross section; and
   said phase-coherent combiner having a means of external optical feedback for all said active elements.

14. A compound laser system according to claim 13, wherein said optical fibers having rectangular cross section are able to maintain polarization of transmitted light.

* * * * *